United States Patent [19]

Eberle

[11] 3,982,105

[45] Sept. 21, 1976

[54] DEVICE FOR THE AUTOMATIC READING AND EVALUATION OF RECORDED CURVES

[75] Inventor: Karl Heinz Eberle, Carouge, Switzerland

[73] Assignee: TVI-Television Industrielle S.A., Switzerland

[22] Filed: Nov. 11, 1974

[21] Appl. No.: 522,868

[30] Foreign Application Priority Data

Nov. 16, 1973 Switzerland ........................ 16157/73

[52] U.S. Cl. ........................ 235/92 DN; 235/92 TC; 235/92 R; 346/15

[51] Int. Cl.[2] ........................................ H03K 21/34

[58] Field of Search ......... 235/92 DN, 92 T, 92 TC, 235/92 TF; 340/174.1; 346/15, 33 D, 74.1

[56] References Cited

UNITED STATES PATENTS

| | | | |
|---|---|---|---|
| 3,380,020 | 4/1968 | Clark | 235/92 T |
| 3,718,808 | 2/1973 | Kelch et al. | 235/92 DN |
| 3,818,342 | 6/1974 | Stevens | 235/92 FQ |
| 3,846,701 | 11/1974 | Sampey | 235/92 DN |

*Primary Examiner*—Gareth D. Shaw
*Assistant Examiner*—John P. Vandenburg
*Attorney, Agent, or Firm*—Robert E. Burns; Emmanuel J. Lobato; Bruce L. Adams

[57] ABSTRACT

Tachygraph recording discs carrying traces disposed in concentric strip-like tracks are analyzed in a device comprising a radial row of sensor cells under which the disc is rotated to provide point-by-point scanning of radial lines at a preselectable frequency given by clock pulses, the speed of rotation of the disc being controlled so that the scanning of each line corresponds to a given unit e.g. 1 minute of the disc time scale. Traces having different radial widths and locations, and which may possibly overlap, are detected as digital pulses which can be discriminated by a logic circuit and separately added and supplied to a recording and/or display device.

1 Claim, 6 Drawing Figures

DEVICE FOR THE AUTOMATIC READING AND EVALUATION OF RECORDED CURVES

The invention concerns a device for the automatic reading and evaluation of at least two curves recorded on a record-carrier, which lie within strip shaped parallel tracks, especially of traces of tachygraphs along concentric tracks of a disc graph, comprising a photoelectric reader having sensor cells arranged in a row for scanning a line cutting the tracks at right angles, a driving device which moves the record-carrier past the reader in the direction of the tracks, a pulse generator providing clock pulses having a fixed preselectable relationship to the speed of the record-carrier, and a logic circuit which is able to discriminate between the different possible breadths of the recorded curves.

Lorries and omnibusses are generally equipped with a tachygraph which records in the form of curves the vehicle's travelling and standstill times, the distances travelled and the speed. This information is recorded on the upper disc graph of a stack of disc graphs driven by clockwork and making for example one revolution per 24 hours. The curve corresponding to the travelling time is recorded in the form of a trace resulting from a pencil being moved backwards and forwards during the journey by a weight made to oscillate within limited amplitude at right angles to the direction of the time scale. Because these recording lines lie very close together, the result is a broad practically uniformly covered recording trace. By providing different radial positions of the trace and/or different trace widths it is also possible to record in various ways the working times to different drivers on the one hand, and on the other hand for example the net travelling times and the working times occupied by other tasks, or the stand-still times of the vehicle with the engine running.

These disc graphs must subsequently go for checking and analysis, in order to ascertain whether the driver has kept to the legally prescribed rest periods and how far the vehicle has travelled. Checking this information is already mandatory in many countries. The recorded speed curve is usually only analysed after an accident.

An aim of the invention is to develop a device of the type described in the introduction in such a way that in principle all curves appearing on the record-carrier are separately comprehensible through linear sensing and that all non-useful areas of the record-carrier lying parallel to the tracks, which can contain "interference" marks or other false information, can be shielded in a simple way, and further that the device can be matched in a simple way and with a minimum of adjustments or modifications to various types of record-carriers and recording means as well as to varying tolerance conditions. Accordingly, the invention aims to provide a device especially suitable for the analysis of tachygraph diagrams of various sorts, but also usable for the evaluation of recorded curves of a similar character, e.g. of curves of a machine running under surveillance, or of time diagrams of temperature and humidity, etc.

Starting with a device of the type described in the introduction, the invention solves the tasks as set out in the appended statement of claim.

Thus in the device according to the invention a reader, known per se, is used for the periodic point-by-point scanning of a straight line with a preselectable repetition frequency, and in a simple way in the discrete video pulses generated in succession by the reader when scanning a curve or trace by the relevant sensing elements are used to identify the position and the width of the scanned curved, the required information being obtained by digital adding of the video pulses occurring within a evaluating window. Moreover the sometimes considerable curve and width tolerances can be taken into account by specifying definite ranges of video pulse numbers, which represent definite width ranges of the curves. In addition, by a line scanning along a radius of a disc graph, all concentric curves can be separately analysed in a simple manner even if adjacent tracks or the tolerance widths of adjacent tracks overlap, because the position and breadth of the evaluating windows can be specified by a simple adjustment of the pulse counter's preselectable ranges. By the same means, the device according to the invention can also be simply and conveniently adjusted to different types of disc graphs and to curves of different characters.

An embodiment of the invention is described in greater detail in conjunction with the accompanying drawings, in which.

Figure 1:
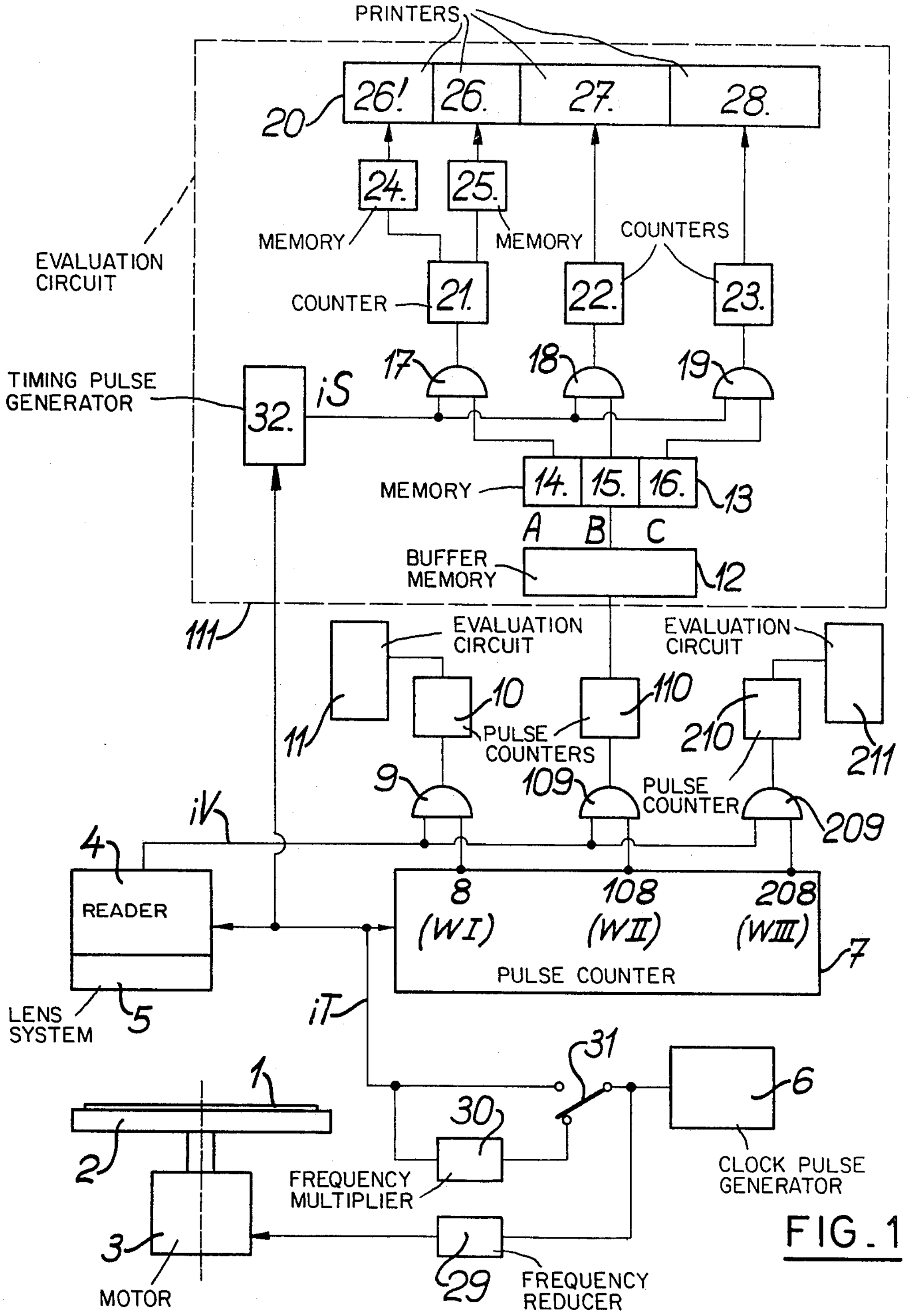
FIG. 1 is a schematic block circuit diagram of a device according to the invention for the analysis of completed disc graphs of a tachygraph.
Figure 2:
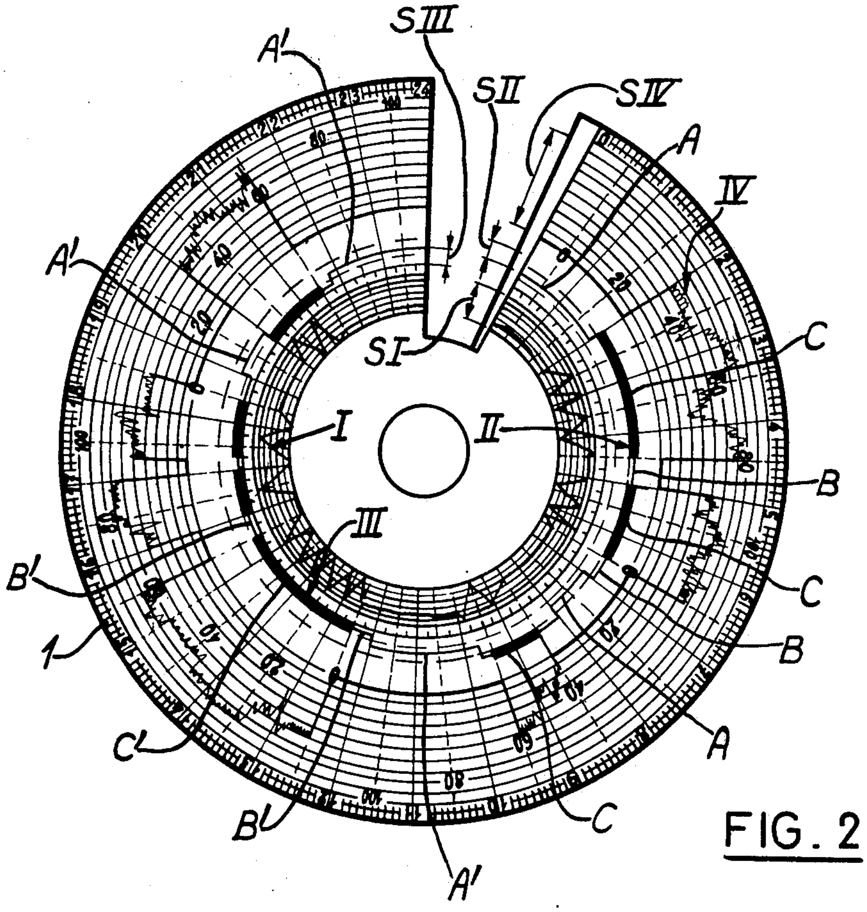
FIG. 2 is a plan view of a completed disc graph of a tachygraph.

FIG. 2 shows a disc graph of a known tachygraph which is to be analysed with the device according to FIG. 1. It has four curves I to IV disposed within concentric tracks SI to SIV. The inner curve I indicates the distance travelled, in which the distance measured between adjacent extremes of the curve, i.e. between a maximum and an adjacent minimum, represents a distance of 5 km.

Curve II represents the travelling and standstill times of the vehicle when being operated by one driver, and curve III the same data when the vehicle is being operated by a second driver, the breaks or rest periods including the standstill time and the times occupied by other tasks being recorded on appropriately staggered concentric parts of these curves. The linear sections marked A represent the rest periods, the curve sections C which are broad and filled in black represent the travelling times, and the linear sections marked B represent the times occupied by other tasks of the first driver, whereas the corresponding sections of curve III marked A', B' and C' refer to the second driver. The broad sections C, C' of the curves showing the travelling times are generated in a known way be means of a vibrating pendulum in the tachygraph whose oscillation amplitude is limited by stops. The fluctuating lines drawn in this way thus appear as a beam because of the slow turning of the disc graph, but their blackened surface however usually has irregularities and is not sharply bounded. The outer curve IV is a speed curve which is not analysed in the version considered. The disc graph according to FIG. 2 contains the information recorded during 24 hours, the time scale being printed on the outer circumference of the disc.

According to FIG. 1 a completed disc graph 1 is fixed to a plate 2 for analysis, the plate 2 being rotated by a synchronous motor 3. A photoelectric reader 4, known per se, serves to read off by point-by-point scanning lines with a definite repetition frequency. For this purpose the reader 4 has a large number of photoelectric cells arranged side-by-side in a row above the disc graph 1 with the row of photoelectric cells extending parallel to a radius of the disc graph 1 and, by means of a lens system 5, linear radial area of the disc is formed as an image on the photoelectric cells. To control the point-by-point scanning of a line with a pre-selectable repetition frequency, clock pulses *i*T generated by a pulse generator 6 are emitted periodically in succession to the photoelectric cells in order to ascertain the information stored during the scanning of a line. The clock pulses *i*T simultaneously control the synchronous motor 3 through an appropriate frequency reducer 29.

The pulse generator 6 can be built into the reader in which case its clock pulses *i*T are also used to control the synchronous motor 3 and further functions still to be described, or else a separate external pulse generator 6 is used which can be formed simply by a frequency converter appropriately modifying the frequency of the a.c. mains.

The reader can for example have 256 photoelectric cells. The frequency of the clock pulses lies preferably between 100 and 200 kHz, whereas the repetition frequency of the linear scanning which is also taken from the clock pulses can for example be 600 Hz. The scanning velocity and the speed of rotation of the disc graph 1 are coordinated in such a way that the scanning of a line takes place in each of the time sectors on the disc graph corresponding to a recorded minute. With a repetition frequency of 600 Hz, the whole 24-hour diagram will therefore be read off in 2.4 seconds, during which the disc graph in the example considered according to FIG. 2 turns by 12/13 of a revolution, because it has a gap extending over about 28° and therefore a time-scale extending over about 332°.

If necessary, the driving motor 3 can be a step-by-step motor which provides forward movement by equidistant angular steps.

Figure 3:
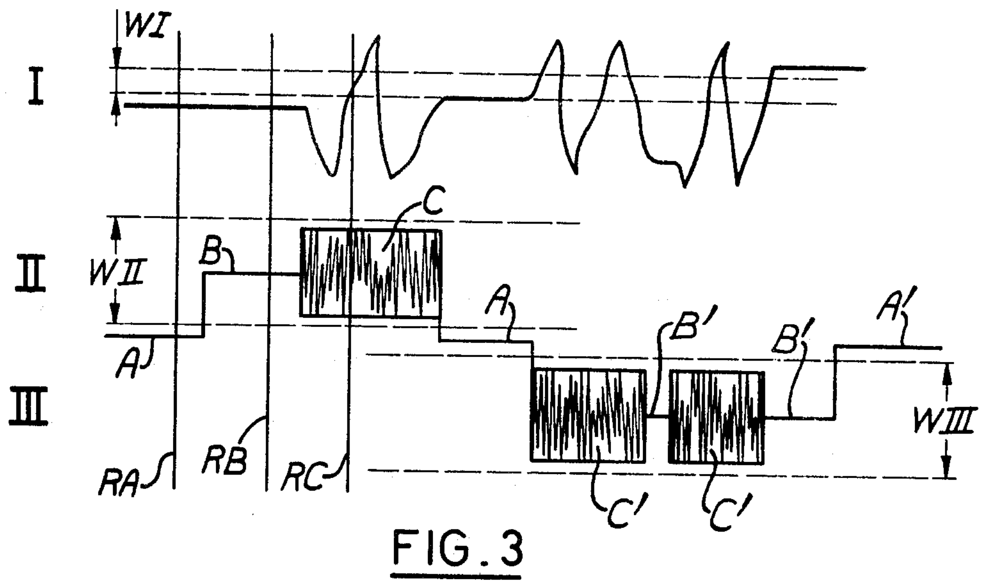
FIG. 3 is a diagrammatic view of a section of the curves to be analysed, represented in a right angled co-ordinate system, of a disc graph of the type shown in FIG. 2, and includes an indication of the scanning radii and the evaluating windows.

The lines scanned by the reader 4 are at right angles to the tracks SI to SIII. FIG. 3 shows three such scanned radii, marked by RA, RB and RC. Upon scanning a section of a curve, the actuated photoelectric cells of reader 4 deliver video pulses *i*V in phase with the clock pulses *i*T which if necessary after appropriate pulse shaping are taken off as discrete pulses. If the reader 4 used generates rectangular video signals at its output whose duration corresponds in each case to the number of successive photoelectric cells actuated by reading a section of the curve, if suffices simply to chop this rectangular signal in phase with the clock pulses *i*T; for example such rectangular signals and the clock pulses *i*T are delivered to respective inputs of an AND element, whose output delivers discrete video pulses *i*V.

These video pulses *i*V, according to FIG. 1, are fed to one of the inputs of three AND elements or gates 9, 109 and 209. The other inputs, namely the control inputs of these gates are connected to the three outputs 8, 108 and 208 of an electronic pulse counter 7 with adjustable presetting. This pulse counter 7 is also connected to the pulse generator 6 and is switched forward by the clock pulses *i*T during the period of each linear scanning along a radius, and is automatically reset to zero at the end of each period. In the example considered, the pulse counter 7 has three preselectable ranges allocated to the three outputs 8, 108 and 208. Each preselectable range is defined on the one hand by a fixed preselectable counter state or threshold at which an output signal is given to a respective output, and on the other hand by its length, i.e. by the adjustable duration of this output signal or the number of clock pulses which, starting at the particular preselected counter state, will generate output pulses. In the presence of these output pulses the appropriate gate 9, 109 and 209 is opened.

The adjustable preselectable ranges define in this way evaluating "windows" WI, WII and WIII along a scanned radius, as indicated in FIGS. 3 to 6. The position and size of these evaluating windows thus determines those sections of radii in the area of the tracks SI, SII and SIII which are to be analysed separately. Adjustment of the pulse counter 7 to different preselectable ranges can be made in known ways, e.g. with so called decoder fields or also by means of appropriate adjusting knobs on the pulse counter.

Figure 4:
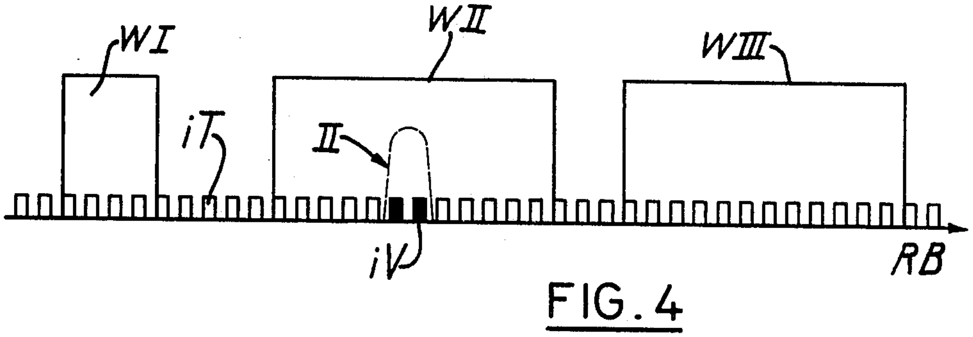
FIGS. 4 and 5 are graphs of the video pulses obtained by scanning two different radii of the disc graph.
Figure 5:
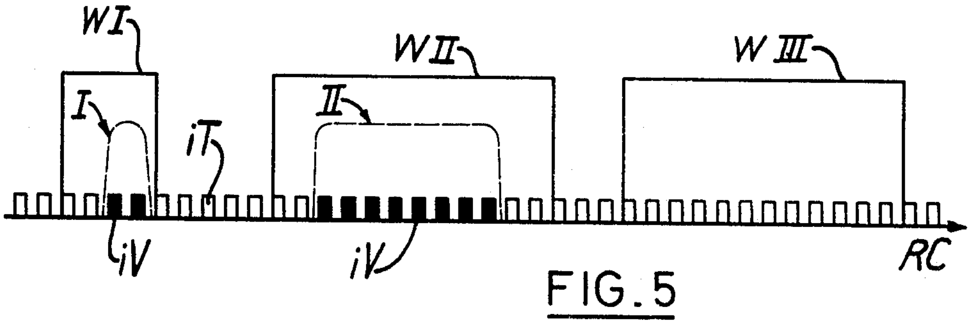

According to FIGS. 4 and 5 during the scanning of each radius of the disc graph from inside to outside the evaluating windows WI, WII and WIII allocated to curves I, II and III respectively are successively "opened" and the sequence of video pulses *i*V occuring in these evaluating windows, i.e. appearing at the outputs of the gate 9, 109 or 209 respectively, are captured. In FIGS. 4 and 5 these video pulses *i*V are represented by black rectangles, whereas the clock pulses *i*T are indicated by plain rectangles.

The evaluating window WI shields from curve I a narrow area, cutting the curve between each adjacent maximum and minimum, which in the example in question corresponds to four clock pulses. If during the linear scanning along radius RC (FIG. 5) a section of curve I lying in the evaluating window WI is captured, then for example two video pulses *i*V occur. When scanning along radius RB (FIG. 4), on the other hand, curve I does not pass through window WI, and as a result no video pulse appears in the evaluating window WI, the same applies for radius RA.

The evaluating windows WII and WIII for evaluating curves II and III respectively are so chosen that in each case they cover both the thin curve sections B or B' and the broad blacked-in curve sections C or C', but not the thin curve sections A or A' corresponding to the break periods. The broad curve sections C and C' respectively correspond to the travelling times of the first and second drivers, while the linear curve sections B and B' respectively correspond to the working times of the two drivers during which they are performing other tasks, e.g. loading and unloading the vehicle. If a scanned radius RA (FIG. 3) cuts a curve section A, no video signal appears in the evaluating windows. If a scanned radius RB cuts a curve section B, as in FIG. 4 for instance, two video pulses *i*V appear in the evaluating window WII and correspond to the line thickness of the curve section B. If a scanned radius RC cuts a section of curve C, the video pulse sequence generated in the evaluating window WII embraces for instance eight pulses (FIG. 5). In reality there will be considerably more than eight video pulses because of the thickness of curve section C, so that FIGS. 3 to 6 should only be regarded as diagrammatic representations.

Taking into consideration the fact that tachygraph curves have numerous irregularities and that in particular curve sections C do not always appear completely covered in black and are not bounded by sharp lines, the following evaluating criteria can for instance be specified to distinguish the various times A, B and C.

If during a scanning period, i.e. during the scanning of a radius, fewer than two video pulses appear in the appropriately chosen windows WII or WIII, this is taken to be a break period. Application of this criterion will ensure that a single video pulse, perhaps generated by a dust mark, cannot produce false information.

If more than six video pulses occur in evaluation windows WII or WIII, this is taken to be travelling time. If between two and six video pulses appear in the evaluating window, other working times of the driver in question are involved during which he is on duty but not driving.

For the evaluation of the video pulses appearing in each evaluating window, video pulse counters 10, 110 and 210 respectively are connected to the outputs of gates 9, 109 and 209 respectively. These counters count the number of video pulses actually appearing in an evaluating window during a scanning period, and are automatically set back to zero after each scanning period. An ordinary storage and evaluation circuit 11, 111 or 211 is connected after each video pulse counter. During scanning of each radius of the disc graph 1 the output pulses which open gates 9, 109 or 209 appear in succession at the outputs 8, 108 or 208 of the pulse counter 7, when the counter state of the pulse counter 7 passes through the preselectable ranges set. Hence, the evaluating window WI is allocated to the counter output 8, the evaluating window WII to the counter output 108 and the evaluating window WIII to the counter output 208.

The storage and evaluation circuits 111 and 211 are similar and only circuit 111 is shown in detail in FIG. 1. This incorporates a buffer store 12 connected after the video pulse counter 110. The state of the video pulse counter 110 is transferred at the latest after the scanning of each radius of the disc graph 1, to buffer store 12 which can assume three storage states. The first storage state comes about if during a scanning period no video pulse is counted in the video pulse counter 110, or as assumed above possibly a single video pulse is counted as a result of an interference mark, and therefore represents the break times A. The second storage state comes about if during a scanning period more than six video pulses are counted and thus represents the net travelling times C of the driver in question. The third storage state comes about if during a scanning period between two and six video pulses are counted in the video pulse counter 110, and thus represents the working times B occupied outside the net travelling times of the driver in question.

The storage states of buffer store 12 are transferred to a further store 13 at the latest at the end of each scanning period or also when, for example, the evaluating window in question is closed by means of for example a pulse derived from the clock pulses. Store 13 contains three storage elements 14, 15 and 16 associated with the three different storage states of the buffer store 12. The state of store 13 only changes during a transfer of information from the buffer store 12 if the latter has changed its storage state in the scanning period preceding the transfer.

The outputs of the storage elements of the store 13 are connected with respective inputs of three gates 17, 18 and 19 in the form of AND elements to whose other inputs are delivered at preselectable time intervals which correspond to minute intervals on the time scale of the disc graph, interrogative pulses *i*S for the temporary opening of these gates. These interrogative pulses *i*S are generated by a pulse generator 32 controlled by the clock pulses *i*T.

In the example considered, the disc graph according to FIG. 2 has a slit extending over a thirteenth of 360°, i.e. about 28°, necessitated by the retaining mechanism of these disc graphs in the tachygraph. Thus the 24-hour time scale of the disc corresponds to only 12/13 of the disc's circumference. Accordingly the scanning velocity and the frequency of the interrogating pulses are so related to the speed of rotation of the motor 3 and the disc graph 1 that a complete reading off of the disc graph, corresponding to 24 recording hours or 1440 recording minutes, takes place during 12/13 of a revolution of the disc graph. In the example considered in FIG. 1, it is assumed that the motor 3 is always driven with the same speed of rotation for the analysis of all possible types of disc graph and that the frequency of the pulse generator 6 is matched to a 24-hour time scale extending over the entire circumference of the disc graph, i.e. over 360°. Because of this, when analysing a disc graph according to FIG. 2 whose 24-hour time scale extends over an angle of only about 322°, the output frequency of the pulse generator 6 is increased by frequency multiplier 30 by a factor of 13/12.

If a disc graph of another type with a 24-hour time scale extending over 360° is to be analysed, then simply by reversing switch 31 in FIG. 1 the output pulses of the pulse generator 6 can be used directly as clock pulses *i*T. It is obvious that by simply increasing or decreasing the output frequency of pulse generator 6 analysis of any other type of disc graph with other recorded time scales can be carried out, for example those which extend over a 24-hour time scale of only 180°.

Instead of adapting the frequency of the clock pulses *i*T to the recording time scale, the speed of rotation of the motor 3 can be adapted by appropriate alteration of its supply frequency, while maintaining a constant clock pulse frequency.

In this manner, in each case the frequency of the interrogating pulses *i*S is made to correspond, for all possible types of disc graphs, to the same periods or intervals of the recorded time, preferably minutes.

In time with the interrogation pulses, and according to which of the storage elements of store 13 contains stored information at the moment under consideration, output signals will appear at the respective output of AND element 17, 18 or 19 and represent the presence of a section of curve A, B or C respectively. These output signals are added in counters 21, 22 and 23 connected after the respective AND elements. After the complete analysis of a disc graph, the states of the counters 21, 22 and 23 can be delivered in the form of a control signal to printers 26, 27 and 28 connected after the counters, and printed in the form of tables. These tables containing the values of the disc diagrams for successive days permit an accurate check of the daily activities of the driver in question with regard to his breaks, his travelling times and his other working times. Naturally automatic addition of the daily times in question over a week or a month is possible.

It is often demanded that for the curve sections A or A' corresponding to break times, it should be possible to separately check the specified night rest on one hand and the other short day breaks on the other hand.

The night rest is defined on the disc graph by an initial section of curve A which begins at midnight, i.e. at the starting point of the analysis of a disc graph, and extends to the first appearance of a curve section B or C, any by a second curve section A which continues from the last curve section B or C to 2400 hours, i.e. to the final point of the analysis of the disc graph. In order to distinguish these two sections of curve from the other curve sections A of the curve representing the break times, the counter 21 allocated to the curve sections A in the version shown in FIG. 1 has two separate outputs. Counter 21 is also so arranged that when a pulse corresponding to the working time of the driver in question, i.e. to curve section B or C occurs, i.e. always at the end of a break period, it transfers its counter state via one or the other output to a special counter store 24 to 25 and is automatically reset to zero. The evaluation circuit is so arranged that the counter state of counter 21 is transferred via a particular one of its outputs to counter store 24 after completion of counter 21's first counting period immediately succeeding the beginning of an analysis at "0 hour". The first counting period corresponds to the scanning of the first curve section A which represents the night rest and is interrupted at the beginning of the working time when a curve section B or C is detected for the first time. The initial appearance of a pulse corresponding to a section of curve B or C, which will be delivered to counter 22 or 23, has for consequences that the counter state of counter 21 is delivered to the counter store 24, that counter 21 is automatically reset to zero and that in addition counter 21 is switched in such a way that the output of the subsequent counter state of counter 21 is delivered via its other output to counter store 25. Accordingly, the pulse sequences occurring in the course of further evaluation, which in general correspond only to short day breaks, i.e. the further curve sections A, after addition thereof in the counter 21, are successively transferred to the counter store 25 and there added up. This transfer occurs during the resetting of counter 21 to zero, always, after termination of a break period, i.e. at the appearance of a curve section B or C. Because the last curve section A after completion of the working time and extending to "24 hours" is no longer interrupted by a pulse representing a work period, i.e. the occurence of a curve section B or C, the counter state corresponding to the length of this last curve section A is stored in counter 21 at the end of the analysis, and can either be delivered to the counter store 24 for completion of the analysis, which will then have a counter state representing the complete night's rest, or the last counter state is left stored in counter 21 until the subsequent analysis. In this case, at the beginning of the subsequent analysis the pulses which correspond to the first curve section A, i.e. the second part of the night rest, are added to the already existing counter state, so that the transfer to the counter store 24 occurring on completion of this period represents the sum total of the first part of the night rest, according to the recording on the previously analysed disc graph, and the second part of the night rest as from midnight. The storage states of counter stores 24 and 25 can be read at preselectable time intervals, corresponding to a daily, weekly or monthly check, to control printers 26' and 26 of the recording device 20, so that this data is also available in the formed desired, e.g. printed in tables.

The storage and evaluation circuit 111 described in conjunction with FIG. 1 can of course be modified and/or supplemented and can for instance be in the form of a micro-computor. If a more accurate analysis of the data for one day is required, the travelling, break and other working times mentioned can also be recorded at shorter intervals of the day, e.g. every hour. It is also possible to add and record separately the breaks and/or the working times according to different preselectable break lengths and working time lengths respectively. Thus for instance all break periods of less than ten minutes can be recorded separately from break periods of more than ten minutes, or all break periods of less than ten minutes can be disregarded. Mean daily break times can also be automatically determined and recorded, for instance every week.

The most common case of analysis in compliance with the general regulations consists of separately adding up the periods of time mentioned, over in turn 24 hours and a week, so that the sum totals of the break times, the working times at the wheel and the other working times of the driver in question for these periods are directly available.

The storage and evaluation circuit 11 which processes pulses corresponding to curve I can be built comparatively simply with known components, e.g. by using flip-flops (bistables) so that a pulse will always be stored and recorded if, after one or several successive scanning periods in which each video pulse indicates the presence of a section of curve I in the appropriate evaluating window WI, a scanning period occurs for the first time in which no video pulse appears. This means that a distance signal is always recorded if one of the flanks running between the two extremes of curve I has been sensed. Each distance signal corresponds to a distance travelled which is defined by the distance between two adjacent extremes of curve I, i.e. for example a distance travelled of 5 km. A simple addition of these distance pulses per day and/or or per week gives the distances travelled in 24 hours or per week. Successive additions of the distance pulses can of course also be carried out over shorter periods, to enable a more accurate analysis to be made. The corresponding store values can then be read by interrogating pulses, as in the description of circuit 111, and used to control an appropriate printer.

Figure 6:
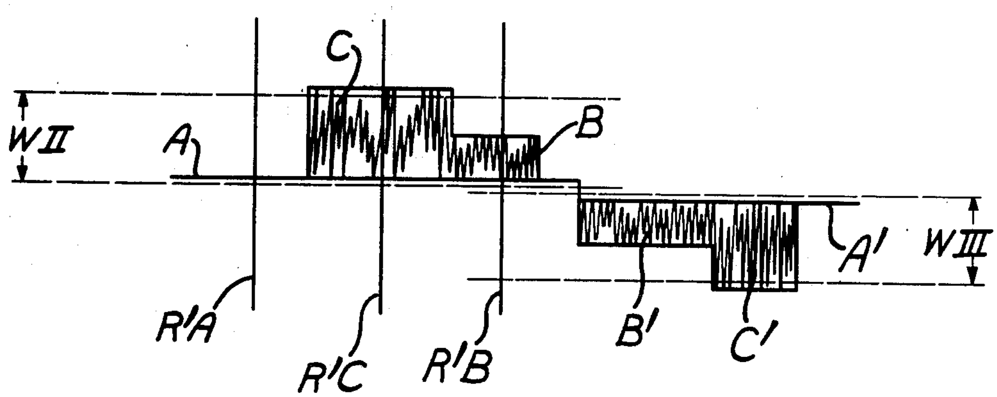
FIG. 6 is a view similar to FIG. 3 of the curves of another type of tachygraph and their analysis.

FIG. 6 shows, according to orthogonal coordinates, a section of a tachygraph curve traced in a different manner. Here the thin curve sections A and A' respectively represent the break periods of the first and the second driver. The broad curve sections B and B' filled in in black represent the working times except for the net travelling time, and the still broader curve sections C and C' filled in in black the net travelling times of the driver in question. In this case the evaluating windows WII and WIII, which are each allocated to a driver, are so chosen that each evaluating window covers the curve sections A and A' respectively and a zone of the breadth of curve sections C and C' sufficiently exceeding the areas of curve sections B and B'. By scanning the three radii R'A, R'B or R'C indicated in FIG. 6, the available information on the one driver is obtained in the evaluating window WII. By adjusting the store connected after the video pulse counters, the three criteria can for example be selected as follows: The presence of fewer than three video pulses, corresponding to a scanning along radius R'A, is taken as break time. The occurrence of between three and twelve video pulses, corresponding to a scanning along radius R'B, is taken as a working period not occupied by driving, and the occurrence of more then for example twelve video pulses, corresponding to scanning along radius R'C, is taken as travelling time for the driver in question. The same applies for the analysis of the pulses appearing in the evaluating window WIII in relation to the curve sections A', B' and C' allocated to the other driver.

The example show that, in accordance with the invention, solely by adjusting the preselectable ranges of an electrical pulse counter it is possible to choose a set of evaluating windows, disposed on parallel or radially disposed lines, for all possible types of diagrams and curves, so that during a linear sensing several curves can be simultaneously and separately detected and analysed. The evaluating windows can also partly overlap one another. In particular, through the choice of an adequate radial breadth of the evaluating windows, curve traces which are not exactly concentric, as sometimes happens in tachygraph diagrams as a result of mechanical inaccuracies, can be perfectly detected. Information read off within an evaluating window can be simply identified by digital addition of the video pulses, in which different curve widths representing different information can be simply and separately detected since each characteristic curve width, allowing for its possible tolerances and irregularities, is allocated to a corresponding range of video pulse numbers. The device according to the invention can therefore be adapted, without complicated modification of the circuit, to different types of diagrams and recording means.

If for example the travelling and stationary times of the vehicle are recorded on radially separated tracks, and the distance or speed curve overlaps the track of the curve representing the stationary times, separate evaluating windows each with video pulse counters connected after them can be provided for reading the curves representing the travelling and the stationary times, the counters being connected together by a logic circuit in such a way that signals coming from the distance or the speed curves are suppressed.

Moreover the speed curve IV in the example of FIG. 2 can also be analysed to determine if the driver has at any time exceeded the maximum prescribed speed. It is sufficient for this to provide a further evaluating window embracing that section of a radius into which the recorded curve IV may not project if the prescribed speed is not exceeded. If therefore the presence of a section of the speed curve is detected in this evaluating window, this means that the speed limit has been exceeded.

The device according to the invention is of course also usable for the analysis of other than tachygraph curves, for example graphs on which meteorological data or data characterising the operating behaviour of a running machine has been recorded.

I claim:

1. An automatic curve reader, for reading a plurality of curves disposed along generally parallel tracks, comprising: a clock pulse generator for developing a train of clock pulses; means receptive of said clock pulse train for displacing said curves along a direction generally parallel to said tracks at a rate determined by said clock pulses; scanning means receptive of said clock pulse train for periodically photoelectrically scanning transversely across said tracks and for passing clock pulses therethrough for the duration for which each curve is scanned; and counter means receptive of said clock pulse train for counting clock pulses passed through said scanning means at a rate determined by said clock pulses train and at counting intervals corresponding to the widths of said tracks, said counter means having a plurality of outputs each for developing an output signal representative of the number of clock pulses counted during a respective one of said counting intervals, whereby the different output signals developed by said counter means simultaneously represent widths of respective ones of said curves.

* * * * *